United States Patent [19]

Brunner

[11] Patent Number: 4,841,242

[45] Date of Patent: Jun. 20, 1989

[54] METHOD FOR TESTING CONDUCTOR NETWORKS

[75] Inventor: Matthias Brunner, Kirchheim, Fed. Rep. of Germany

[73] Assignee: Siemens Aktiengesellschaft, Berlin and Munich, Fed. Rep. of Germany

[21] Appl. No.: 161,758

[22] Filed: Feb. 29, 1988

[30] Foreign Application Priority Data

Apr. 10, 1987 [DE] Fed. Rep. of Germany ....... 3712176

[51] Int. Cl.$^4$ ...................... G01R 31/00; G01R 31/02
[52] U.S. Cl. ............................... 324/158 R; 324/713; 324/73 PC
[58] Field of Search .............. 324/71.3, 73 PC, 158 R, 324/158 D; 250/310, 311, 492.2

[56] References Cited

U.S. PATENT DOCUMENTS 4,417,203 11/1983 Pfeiffer et al. .
4,707,609 11/1987 Shimanura ........................ 250/492.2
4,733,174 3/1988 Crosby ............................. 324/158 R
4,755,748 7/1988 Lin .................................. 324/158 R

FOREIGN PATENT DOCUMENTS 0018424 2/1981 Japan ................................. 250/492.2
0000741 1/1985 Japan ................................. 250/492.2
0130121 7/1985 Japan ................................. 250/492.2
0173834 9/1985 Japan ................................. 250/492.2

OTHER PUBLICATIONS

"Reducing Radiation Damage in Insulated-Gate Field-Effect Transistors", by Grosewald et al., IBM Tech. Disc. Bull., 8/71, vol. 14, #3, pp. 811-812.
A Dynamic SingleE-Beam Short/Open Testing Technique Scanning Electron Microscopy 1985, pp. 991-999, by Brunner et al., 7/85.

Primary Examiner—Reinhard J. Eisenzopf
Assistant Examiner—W. Burns

[57] ABSTRACT

A method of testing conductor networks on printed circuit boards and wiring modules comprising charging various points on the conductor network with one or more charging beams while simultaneously irridating the conductor network with a large area holding beam which compensates for charge losses during the charge detecting period which determines whether shorts or open circuits occur in the network.

8 Claims, 1 Drawing Sheet

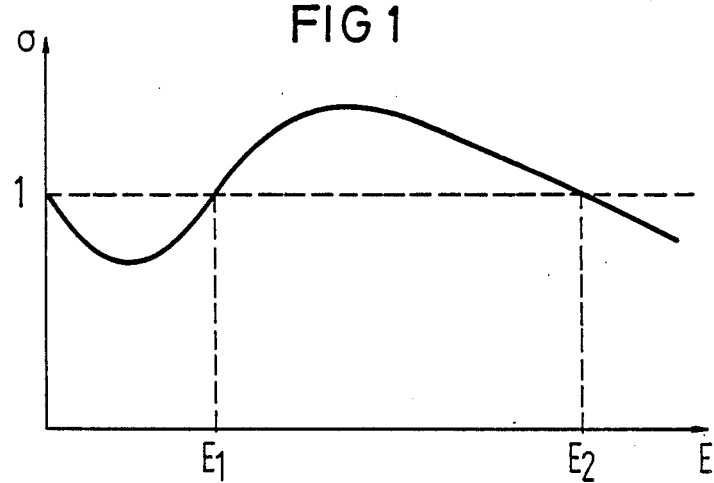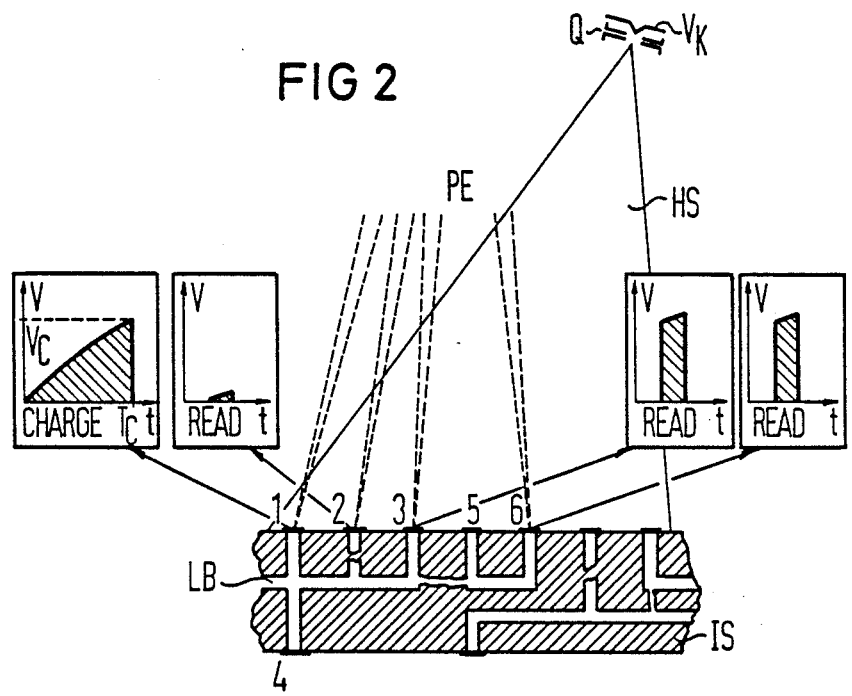

METHOD FOR TESTING CONDUCTOR NETWORKS

BACKGROUND OF THE INVENTION

1. Field of the Invention

The invention relates in general to a method and apparatus for testing conductor networks by secondary emission and which uses a large area second electron beam so as to prevent false indications due to discharges.

2. Description of the Prior Art

Methods are known for testing electrical components, for example, the publication by M. Brunner entitled "A Dynamic Single E-Beam Short/Open Testing Technique", Scanning Electron Microscopy/1985/III, Pages 991–999 discusses an electron beam which has a primary energy that is held constant during the measurement for charging conductor networks and for reading the potentials occurring at the contact points according to the network geommetry so as to detect existing shorts or opens.

U.S. Pat. No. 4,417,203 also discloses a method and apparatus for non-contact testing of wiring modules for shorts and opens using a plurality of electron beams.

The known methods, however, can only be operated without error when the charge applied by the electron beam remains stored in the network during the entire measuring procedure. Since not all printed circuit boards and wiring modules have adequately high insulation resistances of more than $10^{12}$ ohms, parts of the network can be discharged by tracking currents to a degree wherein a secondary electron signal measured in those regions indicates an open which is not in fact present.

SUMMARY OF THE INVENTION

It is an object of the present invention to provide a method and apparatus for testing circuits wherein such discharge is compensated so that inaccurate readings will not occur. In particular, it is assured that the potential generated by a charging beam is stabilized at a higher level wherein the charge condition of a first point of the line network is changed with a first particle beam PE and either the first or a second particle beam PE is directed onto a second point of the conductor network and the charge condition of the second point is read by detecting the secondary particles triggered at this point wherein at least the points of the line network which are charged with the first or second particle beam are also charged with a third particle beam HS which has a particle energy $E_{HS}$ so as to compensate for charge losses occurring in the line network.

The advantage obtainable with the invention particularly comprises that the printed circuit boards and wiring modules having low insulation resistances can be checked for shorts and opens without error.

Other objects, features and advantages of the invention will become apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 1 is a plot of the energy relationship versus the secondary emitted electrons; and FIG. 2 is a schematic view illustrating a printed circuit board having a plurality of networks.

DESCRIPTION OF THE PREFERRED EMBODIMENTS

With a suitable selection of the energy of an electron beam which is directed onto the surface of a non-conductive specimen, it can be achieved that the current of the primary particles incident on the specimen is not compensated by the current of the backscattered and secondary particles emanating from the surface. It is critical for the charging event that the mean number of backscattered and secondary electrons triggered per incident primary electron which is usually referred to as the yield of emitted electrons which in this specification will be referred to as the electron yield. The interdependence is schematically illustrated in FIG. 1. The electron yield passes through a minimum and then usually reaches a maximum and then slowly drops again at higher energy levels. In general, there are two energy values at which $\sigma(E_1) = \sigma(E_2) = 1$ which are shown as $E_1$ and $E_2$ in FIG. 1. An electron beam accelerated to those energies does not change the charge condition of the specimen since an incident primary electron respectively triggers precisely one electron on the average. The point $E_1$ or, respectively, $E_2$ are therefore also referred to as the neutral point energies and typically $E_1$ lies in the energy range below 0.5 keV and point $E_2$ with few exceptions lies in the energy range between 0.5 and 4 keV. When the specimen is irradiated with electrons having an energy that does not coincide with one of the neutral point energies $E_1$ or, respectively, $E_2$ then the non-conductive parts of the specimen are gradually charged positively ($E_1 < E_{PE} < E_2, \sigma > 1$) or negatively ($E_{PE} > E_2, E_{PE} < E_1, \sigma < 1$) until a state of equilibrium is established. For primary electrons having the energy $E_{PE} > E_2$ this state of equilibrium is achieved when the primary electrons are decelerated to such a degree in the electrical field built up above the specimen such that their incident energy just coincides with the neutral point energy $E_2$ characteristic of the respective surface material. Electrons having the energy $E_1 < E_{PE} < E_2$, however, are capable of positively charging the specimen to only a few volts since the kinetic energy of the emitted secondary electrons is to low to leave the specimen any longer. So as to generate high positive potential, the secondary electrons must be extracted from the specimen using an electrode.

By choosing a suitable energy of the charging beam thus potential of any operational sign can be generated on a specimen particularly a conductor network. Since the energy distribution of the emitted secondary electrons is influenced by existing specimen potentials that charge condition or, respectively, the potential at the trigger point of the secondary electrons can also be qualitatively as well as quantitatively identified using an electron beam positioned at the measuring point of interest. The measured quantity is thus the respective secondary electron current registered in a detector mounted above the specimen.

FIG. 2 shows a portion of a plurality of networks of a printed circuit board. The contact point 1, 2, 3 and 4 which are arranged on the surface of an insulating layer IS with interconnects LB connecting these points defines a network A corresponding to a desired electrical function. The contact points 5 and 6 together with the interconnects LB define a second network B which is insulated from network A. The analogous case also applies to the other contact points in FIG. 2 which are not referenced in detail. It can be assumed without limitation that the printed circuit board is not charged before the beginning of the measurement.

So as to check the printed circuit board for shorts and opens, one contact point, for example, contact point 1 of the network A is first charged to a potential $V_C$ using an electron beam PE generated in the electron optical column of a modified scanning electron microscope and contact point 1 is charged with a time constant $T_C$ depending on the capacitance of the network. The time dependency of the contact point potential $V_C$ is shown in the upper left of FIG. 2 in the form of a diagram with a leader connected to point 1. When the desired charging potential $V_C$ has been reached, the electron beam PE is removed from point 1 and is positioned to another contact point of the network A with unmodified primary energy so as to read the potential by recording the secondary electrons which are triggered at that point. When the same secondary electron current, in other words, the same potential $V_C$ exists at the charging point 1 within the measuring time then the two points are connected to one another in a conductive manner. This condition is met for contact point 3 as is shown in the diagram at the upper right of FIG. 2. On the other hand, the contact point 2 remains uncharged because of an open which occurs between contact points 1 and 2 so that a lower secondary electron current is registered at point 2 in the detector. As shown in the right-hand diagram of FIG. 2, the same potential occurs at charging point 1 also exists when the measurement is made at scanning contact point 6. Thus, the two contact points 1 and 6 are thus necessarily connected to each other in a conductive fashion which in this particular circuit means that there is an undesired short between the networks A and B.

In order to reliably record shorts and opens by measuring the potential present at the individual contact points, the charges introduced in the networks A and B must remain stored during the entire measuring time. So as to compensate, for example, the loss of charges resulting from the tracking currents in the present invention, it is proposed that at least those parts of the printed circuit board which are to be scanned are scanned with the electron beam PE are charged during the measurement with a holding beam HS that covers these regions. For example, the holding beam HS can be generated using an electron source Q as shown in FIG. 2 which comprises a cathode, a Wehnelt electrode and an anode that are expediently mounted laterally above the printed circuit board which is to be checked in the specimen chamber of the scanning electron microscope that generates the charging and/or reading beam PE. The energy of the electrons of the holding beam HS can be set by varying the anode potential such that the charge losses caused in the conductor networks by tracking currents are compensated. Since the energy $E_{PE}$ of the charging or, respectively, the reading beam determines the energy $E_{HS}$ of the holding beam electrons as described in the above publication by Brunner, the charging and reading beam are identical. Different beams for generating and reading the potentials are used in the method disclosed in U.S. Pat. No. 4,417,203. Two different operating modes which are referenced a) and b) are to be distinguished.

Operating mode (a) $E_{PE} > E_2$ or $E_{PE} < E_1$, $E_{HS} > E_1$ whereby the condition $E_{PE} - E_2 > E_{HS} - E_1$ must be met in case $E_{PE} > E_2$ and the condition $E_1 - E_{PE} > E_{HS} - E_1$ must be met in the case $E_{PE} < E_1$.

The holding beam $H_S$ which has the energy $E_{HS} > E_1$ (for example, $E_{HS} - E_1 = 50$ eV) stabilizes both the insulator IS as well as the contact points 1 through 6 of the networks A and B to a positive potential defined by the extraction field built up above the printed circuit board with, for example, the assistance of an electrode of the secondary electron detector, or to ground in case the secondary electrons are not extracted. Since a charging beam PE having an energy $E_{PE} > E_2$ or, respectively, $E_{PE} < E_1$ negatively charges the contact point 1 of the network A and all points 3 through 6 that are in conductive connection therewith to the potential $V_C$ ($eV_C = E_{PE} - E_2$ for $E_{PE} > E_2$ or, respectively, $eV_C = E_{PE}$ for $E_{PE} < E_1$), the electrons of the holding beam HS are decelerated to an extent at these points such that they reach these points with a final energy $E_{HS} - eV_C < E_1$. The yield of emitted electrons thus becomes smaller than 1 and the contact points are negatively charged to the potential $V_K$ of the cathode of the holding beam source Q ($V_K$ approximately = to $-100$ through $-150$V), and the holding current automatically compensates any charge losses caused by tracking currents. For surface-wide discharge of the printed circuit board, the energy $E_{HS}$ of the holding beam electron is briefly increased to a degree such that the electron yield $\sigma$ is also greater than 1 at negatively charged contact points.

Operating Mode (b) $E_1 < E_{PE} < E_2$, $E_{HS} < E_1$.

The holding beam HS which has the energy $E_{HS} < E_1$ (for example, $E_1 - E_{HS} = 50$ eV) stabilizes both the insulator IS as well as the contact points 1 through 6 of the networks A and B to the potential $V_K$ of the cathode of the holding beam source Q i.e., for example, to $-100$ through $-150$ volts. Since the charging beam PE which has an energy $E_1 < E_{PE} < E_2$ charges the contact point 1 and all contact points 3 through 6 conductively connected thereto to a positive potential defined by the extraction field built up above the printed circuit board, the electrons of the holding beam HS are accellerated in the region of these points, so that they reach these points with a final energy of $E_{HS} + eV_C$ ($V_c$ indicates the potential generated by the charging beam). The extraction field must thereby be dimensioned such that the conditions $E_{HS} + eV_c > E_1$ is met. The electron yield thus becomes greater than 1 and the contact points remain positively charged, and the holding current automatically compensates for any charge loss. For large-area discharge of the printed circuit board, the energy $E_{HS}$ of the holding beam electrons is briefly reduced to an extent until the electron yield also becomes smaller than 1 at the positively charged contact points.

The invention is not limited to the exemplary embodiments described. Thus, the invention is employable for all methods for testing conductor networks, printed circuit boards, wiring modules, hybrid circuits, SMD assemblies, and etc. wherein a charge introduced into the network must remain stored during the measuring time.

The invention is also directed to preserving the uncharged condition by compensation of the capacitative charging effects as well as for the changes in potential caused by scattered electrons.

It is also not necessary to irradiate the investigated specimen simultaneously over the entire surface, but the holding beam HS can also sweep its surface line-like.

Although the invention has been described with respect to preferred embodiments, it is not to be so limited as changes and modifications can be made which are within the full intended scope of the invention as defined by the appended claims.

I claim as my invention:

1. A method for testing conductor networks comprising the steps of, changing the charge condition of a first point (1) of the conductor network by irridating with a first particle beam (PE), irridating with the first or a second particle beam (PE) a second point (2) of the conductor network, detecting the charge condition of the second point (2) by detecting the secondary particles triggered at said second point, and irridating said first and second points (1, 2) of the conductor network with a third particle beam (HS) which has a particle energy ($E_{HS}$) so as to compensate for losses occurring in the conductor network.

2. A method according to claim 1 wherein the particle energy ($E_{PE}$) of said first beam (PE) is selected such that said first and second points (1, 2) irridated with such beam (PE) are negatively charged; and the particle energy ($E_{HS}$) of said third beam (HS) is selected such that an uncharged point which is irridated by this beam (HS) is positively charged.

3. A method according to claim 1 wherein the particle energy ($E_{PE}$) of said first beam ($E_{PE}$) is selected such that said first and second points (1, 2) irridated with such beam (PE) are positively charged; and the particle energy ($E_{HS}$) of said third beam (HS) is selected such that an uncharged point which is irridated with such beam (HS) is negatively charged.

4. A method according to claim 1 or 2 or 3, wherein said third particle beam (HS) is always switched on when the first or the second particle beams (PE) are switched off.

5. A method according to claim 1 or 2 or 3, wherein the diameter of said third particle beam (HS) on said conductor network corresponds to about the dimensions of a sub-region of said conductor network which is to be tested.

6. A method according to claims 1 or 2 or 3 wherein said third particle beam (HS) is deflected over said conductor network by line scanning.

7. A method for testing conductor networks comprising the steps of, changing the charge condition of a first point (1) of the conductor network by irridating with a first particle beam (PE), irridating with the first or a second particle beam (PE) a second point (2) of the conductor network, detecting the charge condition of the second point (2) by detecting the secondary particles triggered at said second point, and irridating said first and second points (1, 2) of the conductor network with a third particle beam (HS) which has a particle energy ($E_{HS}$) so as to compensate for losses occurring in the conductor network, and wherein the particle energy ($E_{PE}$) of said first beam (PE) is selected such that said first and second points (1, 2) irridated with such beam (PE) are negatively charged; and the particle energy ($E_{HS}$) of said third beam (HS) is selected such that an uncharged point which is irridated by this beam (HS) is positively charged.

8. A method for testing conductor networks comprising the steps of, changing the charge condition of a first point (1) of the conductor network by irridating with a first particle beam (PE), irridating with the first or a second particle beam (PE) a second point (2) of the conductor network, detecting the charge condition of the second point (2) by detecting the secondary particles triggered at said second point, and irridating said first and second points (1, 2) of the conductor network with a third particle beam (HS) which has a particle energy ($E_{HS}$) so as to compensate for losses occurring in the conductor network, and wherein the particle energy (EPE) of said first beam ($E_{PE}$) is selected such that said first and second points (1, 2) irridated with such beam (PE) are positively charged; and the particle energy ($E_{HS}$) of said third beam (HS) is selected such that an uncharged point which is irridated with such beam (HS) is negatively charged.

* * * * *